United States Patent [19]

Maekawa et al.

[11] 4,008,484
[45] Feb. 15, 1977

[54] SEMICONDUCTOR DEVICE HAVING MULTILAYERED ELECTRODE STRUCTURE

[75] Inventors: Shunichi Maekawa, Itami; Hitoshi Kisaki, Kobe, both of Japan

[73] Assignee: Fijitsu Ltd., Kawasaki, Japan

[22] Filed: June 23, 1975

[21] Appl. No.: 589,576

Related U.S. Application Data

[63] Continuation of Ser. No. 373,082, June 25, 1973, abandoned, which is a continuation of Ser. No. 218,553, Jan. 17, 1972, abandoned, which is a continuation of Ser. No. 813,648, April 4, 1969, abandoned.

[30] Foreign Application Priority Data

Apr. 4, 1968  Japan .................................. 43-22262

[52] U.S. Cl. .................................. 357/36; 357/59; 357/71
[51] Int. Cl.² .................................. H01L 29/72
[58] Field of Search ............... 357/20, 34, 36, 56, 357/71, 59

[56] References Cited

UNITED STATES PATENTS

| 3,444,443 | 5/1969 | Moroshima | 357/36 |
| 3,460,007 | 8/1969 | Scott | 357/36 |
| 3,461,357 | 8/1969 | Mutter et al. | 357/36 |
| 3,504,239 | 3/1970 | Johnson et al. | 357/36 |

*Primary Examiner*—Michael J. Lynch
*Assistant Examiner*—Joseph E. Clawson, Jr.
*Attorney, Agent, or Firm*—Herbert L. Lerner

[57] ABSTRACT

A semiconductor device wherein two conductive layers, insulated from one another, are laminated on one surface of a semiconductor wafer is described. The two conductive layers are in ohmic contact with two regions of the opposite conduction type to one another and provided on the surface of the semiconductor wafer. Each of the conductive layers either forms the electrode of this semiconductor device or forms an intermediate part connecting one region on the semiconductor wafer with the electrode. By such an electrode configuration, high output power can be obtained in high-frequency band.

3 Claims, 8 Drawing Figures

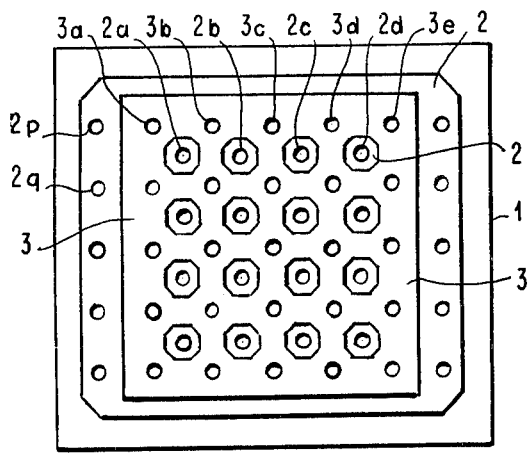
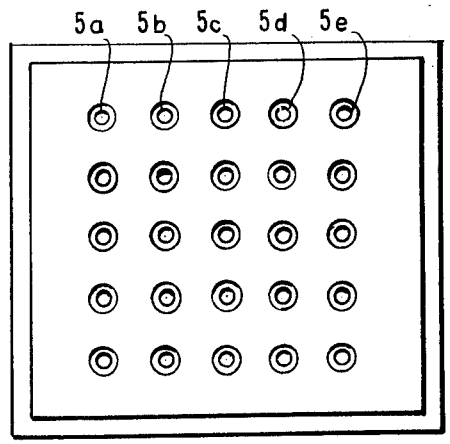
FIG. 1    FIG. 3
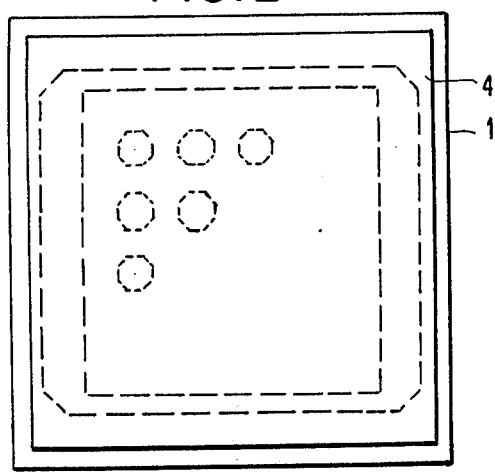
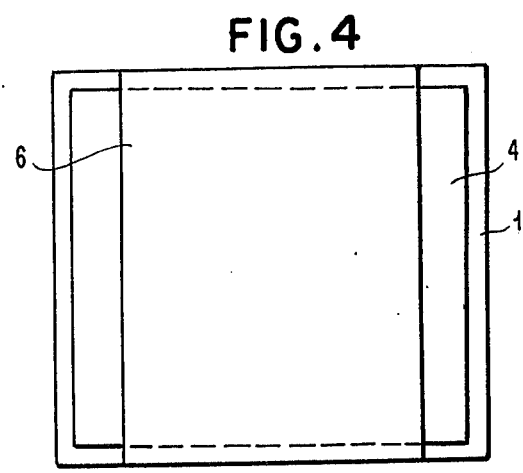
FIG. 2    FIG. 4
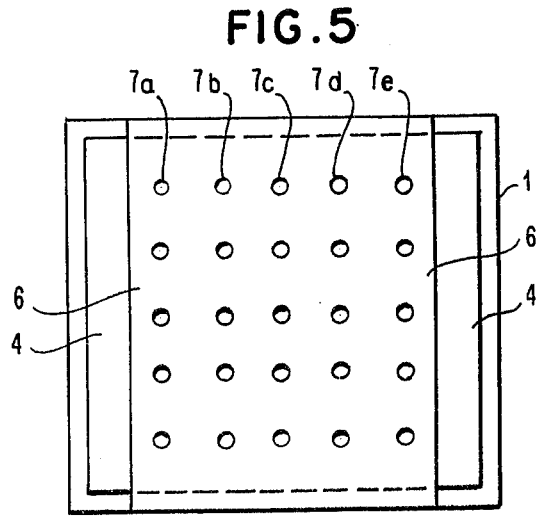
FIG. 5

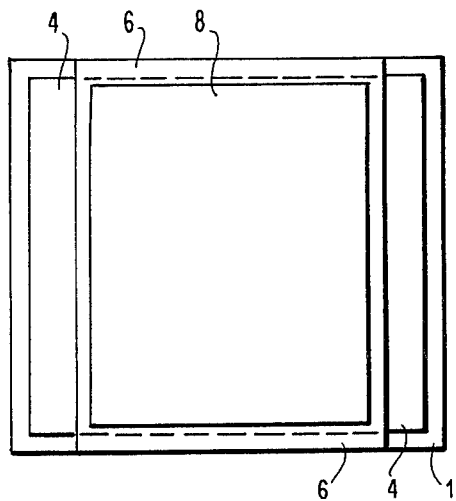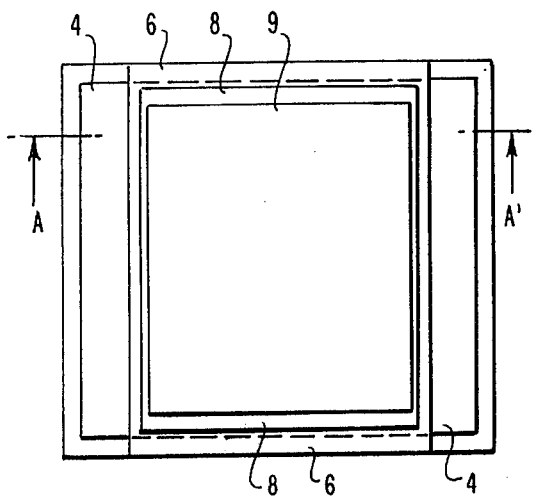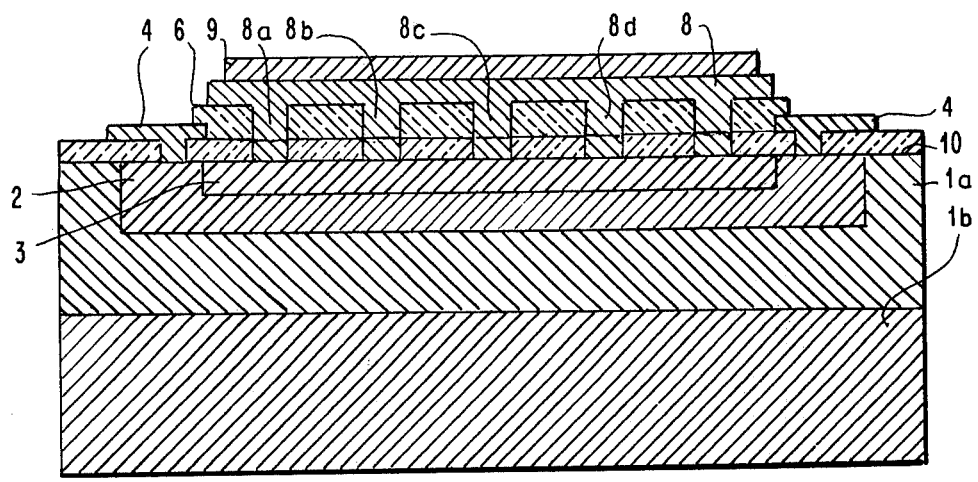

SEMICONDUCTOR DEVICE HAVING MULTILAYERED ELECTRODE STRUCTURE

This is a continuation of application Ser. No. 373,082, filed June 25, 1973, which, in turn is a continuation of Ser. No. 218,553 filed Jan. 17, 1972, which, in turn is a continuation of Ser. No. 813,648 filed Apr. 4, 1969, all abandoned.

Requirements for operation frequency and output power of a high-frequency and high-power transistor have recently become more and more strict. It has become necessary to provide a transistor capable of taking out a high power such as, for example, 10W in UHF band. But when a transistor handles a large electric power as described above, a voltage drop is caused in the base region by the resistance of the base region and base current. As a result, the phenomenon of the emitter current flows concentrating on the peripheral part of emitter nearest the base electrode occurs. This phenomenon is referred to as the emitter edge crowding effect. This effect is particularly marked in a high-frequency and high-power transistor, as it is operated in a high-frequency band, wherein the grounded emitter current amplification factor approximates 1.

Needless to say, in order that a transistor may handle a large electric power, it is necessary to flow a large current. Because of the above-mentioned emitter edge crowding effect, however, even if the area of the emitter is simply enlarged, not only the central part of the emitter region becomes an uneffective part scarcely contributing to current injection but also, particularly in a high-frequency and high-power transistor, a large emitter area deteriorates the performance of the transistor. This is because a larger emitter area results in larger capacitance of the emitter junction. This in turn results in larger area of base region and larger capacitance of collector junction. These operate to deteriorate the frequency characteristic of the transistor.

Thus, in recent high-frequency and high-power transistors, in order to increase the length of the peripheral part of the emitter (hereafter referred to as the emitter periphery length) without too much increasing the junction capacitance, the emitter region is divided into a plurality of stripes or a number of minute islands. These stripes or islands are scattered on the base region. These two methods are already well known and the former is referred to as the interdigitated type and the latter is referred to as the overlay type. Further, recently a high-frequency and high-power transistor was proposed in which the shape of the emitter region is made a planar mesh.

In any of the above types, the size of the emitter region should be made as small as possible. This is because in an emitter region of a large area, as described above, the central part is ineffective. But, if this emitter region is divided into a number of parts and said parts are provided scattered on the base region, the emitter periphery length can be greatly increased without change in the total area of the emitter region. Needless to say, the smaller the size of the divided parts is made, the larger the emitter periphery length can be.

In the conventional method, in attaching electrodes to base and emitter regions of the various kinds of transistors as described above, holes are opened in advance in the required parts of a protective film, covering the surface of the semiconductor wafer, and a thin layer of a metal such as aluminum is deposited by vacuum evaporation on nearly all the surface of said protective film. The thin layer is then removed partially by photo-etching and the emitter electrode is separated from the base electrode. Therefore, the two electrodes are on one plane and insulation between the two electrodes is performed only on this plane.

In such electrode structure, it is inevitable that as the size of the emitter region becomes small, the width of the electrodes also becomes small and the forms of the electrodes also become complicated. Consequently, the process of etching the electrodes requires high precision. This, however, becomes difficult. Furthermore, the resistance of the electrodes becomes of a value which is not negligible.

For example, in an interdigitated type transistor, the longer the shape of the emitter region becomes, the longer the shape of the emitter electrode also becomes. In order to prevent the voltage drop caused by the resistance of the base region described above, it is necessary to provide the base electrode, as close as possible, to the peripheral part of the emitter region. Consequently, the shape of the base electrode also becomes long. The thickness of these electrodes is ordinarily about 2 $\mu$, so that if their shape becomes long, considerable resistance is exhibited with voltage drop being caused by this resistance.

On the other hand, in an overlay type transistor, a number of divided minute emitter regions like islands (hereafter referred to as the emitter small regions) are all interconnected in parallel by the emitter electrode. Since, however, the base electrode and the emitter electrode are provided on one plane, the shape of the two electrodes after all becomes not greatly different from the shape of electrodes in the interdigitated type transistor, i.e. becomes thin and long and mutually interdigitated. Therefore the same problem arises in the overlay type transistor as in the interdigitated type transistor.

Besides the problem as described above, the overlay type transistor has the following problem. As the emitter small regions are connected in parallel by the emitter electrode, considerable part of the base region is covered with emitter electrode. Therefore a metal electrode cannot be attached to this part of base region. For this reason, in a transistor of this type, a diffused layer of low resistivity (hereafter referred to as the conductive matrix) of the same conduction type as the base region is provided between the emitter small regions, and the matrix is used as the base electrode. But since said conductive matrix is a diffused layer consisting of a semiconductor, its resistivity is higher than that of a metal such as, for example, aluminum by about three powers and therefore there is a disadvantage that the base resistance becomes high. Furthermore, if the conductive matrix gets in contact with the emitter region, the characteristic of the transistor is deteriorated and therefore said conductive matrix must be spaced from the emitter small regions by some distance. For this reason, surplus area is required in the base region. Consequently, there arises a disadvantage that the capacity of collector junction becomes large. As a further disadvantage, compared with transistors of other kinds, this transistor requires a surplus diffusion process for the formation of the conductive matrix.

In a transistor having mesh-shaped region, the conductive matrix as described above is not required. In this case, however, the parts of the base region that are in the meshes of the emitter are connected in parallel to the base electrode. Therefore a part of the emitter region is hidden under the base electrode and the emitter electrode cannot be attached to said part of emitter region. Resistivity of the emitter region is lower than that of the base region. Still when the width of the emitter region is extremely narrow, resistance exhibited by the emitter region becomes not negligible. For this reason, voltage drop is caused by the resistance and emitter current in the part of the emitter region that is spaced from the emitter electrode and sufficient current injection cannot be performed.

According to one aspect of this invention, a transistor comprising a semiconductor wafer, a base region formed on one surface of the wafer and of the opposite conduction type to the wafer, an emitter region formed in this region and of the same conduction type as the wafer, a first insulating film for covering and protecting the surface laminated thereon, a first conductive layer laminated on the film, a second insulating film laminated on the first conductive layer and a second coductive layer laminated on the second insulating film are provided. The first conductive layer has ohmic contact with one of the two regions, for example the base region on the surface of the wafer through holes opened in the first insulating film and the second conductive layer has ohmic contact with the other of the two regions, for example the emitter region, by penetrating through the two insulating films. The first insulating film covers and protects the surface of the wafer and the second insulating film is provided between the two conductive layers and insulates these two layers from one another. The part of the second conductive layer that is penetrating through the first insulating film is insulated from the first conductive layer by the first insulating film.

In the preferred embodiment of this invention, the first conductive layer consists of a metal and the second conductive layer consists of a high resistivity material. The first conductive layer in itself constitutes the base electrode. A low resistivity metal layer is deposited further on said second conductive layer and this low resistivity metal layer constitutes the emitter electrode. The part of the second conductive layer consisting of a semiconductor, adds series resistance to the emitter region to thereby prevent local crowding of emitter current.

In accordance with a further feature of this invention, the first and second conductive layers both consist of metals. In this case, no conductive matrix is required even if the emitter region is divided into a number of islands. This is because it is possible to provide the base electrode sufficiently close to the insular emitter small regions.

In the accompanying drawing, like reference symbols refer to like parts.

FIGS. 1 to 7 are plan views showing sequentially the process of manufacturing an embodiment of this invention; and FIG. 8 is an enlarged sectional view taken along the line A — A' of FIG. 7.

This invention can be carried into effect using as material an arbitrary semiconductor of an arbitrary conduction type, but, for the sake of convenience, processes of manufacturing an embodiment of the invention using a wafer consisting of n-type silicon will be described sequentially.

FIG. 1 shows the state of a high-frequency and high-power transistor having mesh-shaped emitter region, immediately before the process of attaching the electrode. In the drawing, a p-type base region 2 and an n-type mesh-shaped emitter region 3 are formed on one surface of an n-type silicon wafer 1, hereafter referred to as the substrate. When the conduction type of the substrate is p-type, needless to say, the conduction type of the base region will become n-type and the conduction type of the emitter region will become p-type. Although 16 mesh holes of the emitter region are shown in the drawing for the sake of convenience, the number can be varied. These are all obvious to experts in the art.

The part of the surface of substrate 1, on which said two regions are formed, is completely covered with a film consisting of an insulating material such as silicon dioxide ($SiO_2$), not shown in the drawing. Besides $SiO_2$, an arbitrary insulating material, used for the protection of p-n junctions in the conventional planar technique, such as silicon nitride and others, may also be used as said film. The substrate 1, as will be obviously shown later in the sectional view, comprises upper and lower layer of different resitivities but such a structure of substrate has heretofore been always adopted in high-frequency and high-power transistors and has no relation to the essence of this invention, and so a homogeneous semiconductor wafer may also be used as the substrate without departing from the spirit of this invention.

Holes for the attachment of electrodes are opened in the required parts of said insulating film. Circles in FIG. 1 show the positions of the holes and 2a, 2b, 2c, . . . and 2p, 2q, . . . are holes for the attachment of the base electrode and 3a, 3b, 3c, . . . are holes for the attachment of the emitter electrode. The holes are circular in the embodiment shown, but they may also be square or rectangular. It is desirable that the arrangement and shapes of holes are determined so that the route through which current flows may become as short as possible in order that the electrode resistance may be made as low as possible. An aluminum coat as shown by 4 in FIG. 2 is deposited on the insulating film on the substrate, by vacuum evaporation. This aluminum layer 4 is caused to have ohmic contact with the parts of the surface of the substrate that are exposed in the bottom of holes. Thus, in the present embodiment, aluminum layer 4 simultaneously has ohmic contact with both of base region 2 and emitter region 3. It is also possible to form ohmic contact with said two regions separately from one another. In the latter case, different kinds of materials may also be used. As shown in FIG. 3, parts of the Al layer 4 that are immediately above holes 3a, 3b, 3c, . . . for emitter electrode are removed by etching. Here, in the present embodiment, as shown in the drawing, the area of the removed parts is made slightly larger than that of said holes and Al is left in the interior of holes as shown by 5a, 5b, 5c, . . . . It is also possible to remove completely the Al in the interior of holes. It is also possible to form first only the base electrode and then form the emitter electrode separately from the base electrode. Particularly when the size of the emitter region is extremely small, it is desirable to deposit a semiconductor material of the same conduction type as the emitter region on the insulating film by vacuum evaporation prior to the formation of the emitter electrode and cause the semiconductor material to have ohmic contact with the emitter region through holes for emitter electrode. This arrangement will eliminate the possibility of deteriorating the operation of the transistor even if the emitter junction is bridged by the deposited semiconductor.

Then, as shown in FIG. 4, an insulating film 6 is coated on Al layer 4. This insulating film may consist of, for example, silicon monoxide SiO and be deposited by vacuum evaporation. Beside SiO, materials such as $SiO_2$ or silicon nitride may also be used. It is possible to deposit $SiO_2$ by thermal decomposition of an organic silicon compound or deposit $SiO_2$ by sputtering.

This insulating film 6 will be hereafter referred to as the second insulating film as it is laminated on the $SiO_2$ film described above with reference to FIG. 1 and Al layer 4 and, on the other hand, the $SiO_2$ film under Al layer 4 will be hereafter referred to as the first (11 in FIG. 8) insulating film. As shown in FIG. 4, peripheral parts of Al layer 4 are not coated with the insulating material but are exposed and said parts are used as lead bonding parts of the base electrode.

Next, parts of said second insulating film 6 that are immediately above holes ($3a$, $3b$, $3c$, ... in FIG. 1) for the attachment of the emitter electrode are removed by etching and Al layers ($5a$, $5b$, $5c$, ... in FIG. 3) in the interior of said holes are exposed to the bottom of the newly opened holes. Here, it is desirable that the diameter of holes $7a$, $7b$, $7c$, ... opened in the second insulating film be made nearly equal to the diameter of holes for the attachment of the emitter electrode.

After the process of etching the second insulating film 6 is finished, a conductive material of a high resistivity is coated on said film and a conductive layer 8 is provided as shown in FIG. 6. The firstly coated Al layer 4 will be hereafter referred to as the first conductive layer and the above-mentioned conductive layer 8 consisting of a high resistivity material will be referred to as the second conductive layer. This second conductive layer 8 adds series resistance to the emitter region and therefore it is desirable that a material having a resistivity of at least above about $10^{-4} -$ be used as the material for constituting the second conductive layer. In the present embodiment, for example, n-type silicon of a resistivity of 0.1 Ω em is used as said material. The second conductive layer can be deposited by vacuum evaporation or sputtering or by epitaxial growth.

Next, as shown in FIG. 7, a metal layer 9 is formed on nearly the entire surface of the second conductive layer 8 consisting of silicon by evaporation. In the present embodiment, it is not necessary to regulate the form of said metal layer 8 by etching and therefore a metal that cannot easily be etched can be used. The thickness of this metal layer 9 can be made considerably great. In the present embodiment, gold (Au) is used as said material and the thickness of said layer deposited by evaporation is made a little above 5 μ. Aluminum may also be used instead of gold. Besides these two metals, almost all metals such as silver, platinum, nickel, molybdenum, titanium and tantalum can be used. This Au layer serves to make the entire surface of the second conductive layer, that is in parallel to the surface of the substrate, of substantially the same potential. Therefore it is desirable that Au layer 9 be provided over almost all of said surface of the second conductive layer 8.

By the above operation, the process of manufacturing a transistor pellet is finished and the pellet of FIG. 7 is placed on and firmly attached to a stem and electrodes are connected to stem leads. This is then sealed hermetically to form a complete semiconductor device.

In this device, Au layer 9 constitutes the emitter electrode and Al layer 4 constitutes the base electrode.

FIG. 8 is a sectional view taken along the line A—A' of the pellet of FIG. 7 and it is evident from FIG. 8 that the second insulating film 6 is provided between first conductive layer, i.e., base electrode 4 and the second conductive layer (consisting of silicon) 8 and the lower part of the second conductive layer is separated from base electrode 4 by the first insulating film 10. For this reason, even though the two conductive layers are both of large area and of the shape of simple plates, the two layers are completely insulated from one another. Incidentally, substrate 1 comprises two layers of upper layer $1a$ of high resistivity and lower layer $1b$ of low resistivity and base region 2 and emitter region 3 are formed in this upper layer $1a$. Such a structure of substrate, however, has no relation with the essence of this invention.

The transistor to which this invention has been applied has advantages as follows based on the structure of electrodes as described above.

In the transistor pellet shown in FIGS. 7 and 8, vertical parts $8a$, $8b$, $8c$, ... of the second conductive layer have ohmic contact with the emitter region through holes $3a$, $3b$, $3c$, ... opened minutely spaced from each other in the second insulating film 6. This means that resistors are intercalated between the contact points of the emitter region and emitter electrode 9. By this resistance, current negative feedback is applied to said contact points and consequently stabilization of current and uniformity of current density between local points of the emitter region can be obtained. The above-mentioned effect can be obtained more or less, even if a high resistivity metal is used as the material for the second conductive layer. Better results can be obtained if a semiconductor such as silicon, germanium or gallium aresenide is used as said material. This will be next described in further detail.

In general, current flowing in a semiconductor is saturated when the electric field in the semiconductor arrives at a certain value. For example, when electric field in silicon exceeds about $10^4$ V/cm, current becomes nearly constant without relation to the applied voltage. Now, if the sectional area of vertical parts $8a$, $8b$, $8c$, ... of the second conductive layer is 10 $\mu^2$ and their length to the emitter electrode is 1 μ and said parts are constituted by silicon of a resistivity of 0.1 Ω em as described above, then resistors of about 100 Ω are intercalated between contact points of the emitter region and the emitter electrode. But after the voltage between the emitter electrode and the emitter region has arrived at about 1V, current scarcely increases, even if the voltage is further increased, because of the above-mentioned current staturation phenomenon. If the saturation current is calculated from the resistance values of said vertical parts, it can be known that current passing through the vertical parts is limited to about 10 mA. This means that current is distributed nearly uniformly to all the parts of emitter region.

The effect of current limitation and uniformity described above not only prevents local overheating or breakage of the transistor but also improves the frequency output characteristic. Namely, in general, if a large current above a certain extent flows to a transistor, $f_T$ (frequency at which the grounded emitter current becomes 1) is lowered rapidly. If local crowding of emitter current occurs, $f_T$ is lowered locally in the emitter region, and thus in the entire transistor. For this reason, uniformity of emitter current can effectively prevent such lowering of $f_T$.

Structure of electrodes by which effects as described above can be obtained is not limited to the embodiment described above and various modifications thereof are possible. First, it is obvious that in FIG. 8 substantially the same effect can be obtained by reversing the base electrode, i.e., the first conductive layer 4 and the second conductive layer 8. In this case, base electrode 4 will be located above the second insulating film 6 and vertical parts thereof will penetrate through the two insulating films 10 and 6.

Further, in the transistor structure shown in FIG. 8, emitter current does not flow uniformly over the entire surface of the part of the second conductive layer 8 that is parallel to the surface of the substrate, i.e., the horizontal part, but mostly flows in the vertical direction through the parts immediately above the vertical parts. For this reason, even if the part of said horizontal part through which no current flows is removed, the operation of the transistor is scarcely influenced. Therefore, even if only vertical parts of the second conductive layer are constituted by a high resistivity material such as semiconductor and the plate-shaped horizontal part is entirely made one layer consisting of a metal, substantially the same operation as the transistor shown in FIG. 8 can be obtained.

Conversely, the operation of the transistor will not be changed essentially either if said vertical parts are all constituted by a low resistivity metal and the horizontal part is constituted by a high resistivity material. However, in this case, as in the case of FIG. 8, it is desirable to laminate a low resistivity metal layer on the horizontal part and use this metal layer as the emitter electrode.

In the embodiment of this invention described above, the emitter region comprises meshes and series resistors are added to the emitter region. But this invention can be applied to transistors having any form of emitter.

Moreover, in the transistor to which this invention has been applied, the resistance of base electrode can be made greatly lower compared with that of an overlay type transistor and therefore voltage drop based on base electrode resistance can be greatly reduced. This is because, the conductive matrix in the overlay type transistor is replaced by a metal of a resistivity greatly lower than that of a semiconductor.

As described above, the transistor to which this invention has been applied, based on the structure of its electrodes, has a great advantage that it is also possible to add negative feedback resistances to emitter small regions where occasion demands and when negative feedback resistances are not required, base and emitter electrodes can be provided sufficiently close to one another and therefore great effect can be obtained particularly when this invention is applied to a high-frequency and high-power transistor having complicated and minutely shaped emitter regions.

Moreover, the planar shape of the emitter electrode as viewed from above the substrate becomes a single sheet of simple plate of a large area. Therefore, in connecting the emitter electrode to the stem lead with a connector lead, bending of the connector lead can be accomplished with ease. And since a sufficiently thick connector lead can be used, resistance and inductance of the connector lead can be reduced. As the result, there is an advantage that frequency characteristic and current capacity of the completed transistor become more excellent.

Furthermore, the transistor pellet to which this invention has been applied can be placed on and firmly attached to a stem in such a manner that the surface of the emitter electrode may be in contact with the upper surface of the stem base. By so doing, it is made possible to effectively radiate the heat generated in the operation of the transistor. In other words, heat generated in the operation of the transistor is chiefly generated in the collector junction. Distance from the collector junction to the surface of the emitter electrode is ordinarily under 10 $\mu$, but distance from the collector junction to the surface of the collector, i.e., the bottom surface of the pellet, is ordinarily about 100 – 200 $\mu$. Therefore, it is far more effective to radiate said generated heat from the surface of the emitter electrode than to radiate it from the surface of the collector. But in the conventional interdigitated type or overlay type transistor, because of the form of electrodes, it is impossible to firmly attach the surface of the emitter electrode of the pellet to the stem and for this reason heat is inevitably chiefly radiated through the surface of the collector side. In the transistor according to this invention, the upper electrode (emitter electrode or base electrode) is a simple plate of a large area and therefore it is possible to firmly attach the surface of said electrode to the stem base and for this reason heat generated in the collector junction can be transferred to the stem through said electrode and can be radiated effectively.

In the transistor in accordance with this invention, it is also possible to make the planar shape of the emitter electrode and base electrode circles and form the two electrodes so that they may form concentric circles when viewed from above. In such a case, the transistor can very advantageously be connected with a coaxial line.

This invention can be applied to transistors having emitter regions of any form besides the embodiments described above and various different conductive materials and insulating materials besides those shown in the embodiments can be used as the materials for conductive layers and insulating films respectively. These will be all readily understood by experts in the art.

We claim:

1. A semiconductor high frequency high power device having a multilayered electrode structure comprising a semiconductor substrate of one conductivity type, a first base region of the opposite conductivity type formed on one surface of said substrate, a second single area emitter region of the same conductivity type as the substrate formed on said first region, a first insulating film for covering and protecting parts of pn junctions formed between said first region and said substrate that are exposed on the surface of said substrate, a first conductive layer formed on said first insulating film and having ohmic contact with said first region through holes opened in said first insulating film, a second insulating film covering the upper surface of said first conductive layer leaving at least a part of the peripheral parts of said first conductive layer uncovered, and a second conductive layer of high resistivity penetrating through said first insulating film and said second insulating film at a plurality of spaced points and having ohmic contact with said second single area region emitter forming resistors separately contacting said single area of the second region at multiple points, without any said resistor extending across said single area region to the borders thereof, and a metal layer on nearly the entire outer surface of said second conductive layer and constituting an electrode sufficiently thick and low in resistivity that the entire outer surface of the second conductive layer parallel to the surface of the substrate is of substantially the same potential during operation, whereby the voltage drop in the second conductive layer during operation is perpendicular to the substrate to prevent local crowding of current, and whereby when current flows in the semiconductor device a uniform potential distribution is produced on the emitter semiconductor region as a result of the currents flowing in said resistors.

2. A device as in claim 1, wherein the second conductive layer is of material with a resistivity at least above about $10^{-4}$ $\Omega$cm.

3. A semiconductor device comprising a semiconductor wafer of one conduction type, a first semiconductor region formed on one surface of said substrate and of the reverse conduction type of said substrate, a second single area semiconductor emitter region formed in said first region and of the same conduction type as said substrate, a first insulating layer covering and protecting parts of pn junctions formed between said two regions and between said first region and said substrate that are exposed on the surface of said substrate, a first conductive layer formed on said insulating layer and having ohmic contact with said first region through first holes in said first insulating layer, a second conductive layer disengaged from said first conductive layer and having ohmic contact with the second single area semiconductor region through a plurality of spaced second holes in said first insulating layer, a second insulating layer interposed between said first and said second conductive layer covering the upper surface of said first conductive layer leaving at least a part of the peripheral parts of said first conductive layer uncovered, whereby second holes in said first insulating layer are aligned with a corresponding number of holes in said first conductive layer and in said second insulating layer, said second conductive layer having portions having a high resistivity penetrating via the second holes through the subsequent layers such that a corresponding number of resistors connected with each other in said second conductive layer is produced substantially perpendicular to the surface of said substrate in contact with the second single area of said semiconductor region, without any said resistor extending across said single area to the borders thereof, whereby when current flows in the semiconductor device a uniform potential distribution is produced on said emitter region as a result of the currents flowing in said resistors.

* * * * *